(12) United States Patent
Fotouhi

(10) Patent No.: US 7,688,154 B1
(45) Date of Patent: Mar. 30, 2010

(54) AMPLITUDE REGULATED CRYSTAL OSCILLATOR

(75) Inventor: Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 233 days.

(21) Appl. No.: 11/425,557

(22) Filed: Jun. 21, 2006

(51) Int. Cl.
  *H03B 5/36* (2006.01)
  *H03L 1/00* (2006.01)
  *H03L 5/00* (2006.01)
(52) U.S. Cl. .................. 331/158; 331/109; 331/116 FE; 331/160; 331/183; 331/186
(58) Field of Classification Search .................... 331/15, 331/74, 109, 116 FE, 158, 160, 183, 185, 331/186
  See application file for complete search history.

(56) References Cited

U.S. PATENT DOCUMENTS

| 3,868,698 | A | * | 2/1975 | Dressler | 347/75 |
| 4,360,789 | A | * | 11/1982 | Lewyn et al. | 331/109 |
| 6,278,338 | B1 | * | 8/2001 | Jansson | 331/116 FE |
| 6,798,301 | B1 | * | 9/2004 | Balan et al. | 331/74 |
| 7,012,472 | B2 | * | 3/2006 | Xu et al. | 331/16 |
| 7,098,753 | B1 | * | 8/2006 | Dumitrescu et al. | 331/182 |
| 7,142,069 | B2 | * | 11/2006 | Costa et al. | 331/182 |
| 7,187,245 | B1 | * | 3/2007 | McMenamy | 331/158 |
| 7,271,674 | B1 | * | 9/2007 | Butenhoff et al. | 331/183 |

\* cited by examiner

*Primary Examiner*—Robert Pascal
*Assistant Examiner*—Levi Gannon
(74) *Attorney, Agent, or Firm*—Townsend and Townsend and Crew LLP

(57) ABSTRACT

To maintain the amplitude of an oscillating signal within a defined range, the detected peak level of the oscillating signal is compared to a reference voltage. If the detected peak level is determined as being greater than the reference voltage, the common source/drain voltage of a differential amplifier driving the crystal oscillator across its input terminals is reduced so as to lower the amplitude of the oscillation signal. If the detected peak level is determined as being smaller than the reference voltage, the common source/drain voltage of the differential amplifier driving the crystal oscillator is increase so as to raise the amplitude of the oscillation signal.

12 Claims, 4 Drawing Sheets

US 7,688,154 B1

AMPLITUDE REGULATED CRYSTAL OSCILLATOR

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to integrated circuits, and more particularly to regulating the amplitude of an oscillating signal.

Crystal oscillators are widely used in electronic circuits and use stable electromechanical resonance characteristics of a piezoelectric crystal, such as quartz, to generate a clock signal. When a quartz crystal is cut along certain crystal axes to form parallel-plate electrodes, it can be made to resonate when excited. The resonant frequency depends on the material and dimensional properties of the crystal, such as the size, the orientation of the crystal faces, and the mounting of the crystal on its mechanical supports. Because of their insensitivity to time and temperature variations, crystal oscillators are widely used in applications requiring clock signals.

FIG. 1 is a transistor schematic diagram of an oscillator 10 as known in the prior art. Oscillator 10 is shown as including a crystal 20 disposed between input and output terminals of a CMOS inverter formed by PMOS transistor 12 and NMOS transistor 14. The oscillation signal generated between nodes X1 an X2 has an amplitude that varies between supply voltages Vdd and ground. Oscillator 10 is thus inappropriate for use in applications requiring relatively high accuracy oscillation frequency driven by small time-varying signals.

BRIEF SUMMARY OF THE INVENTION

In accordance with one embodiment of the present invention, an amplitude modulating circuit adapted to modulate the amplitude of a crystal oscillator includes, in part, a peak detector, an amplitude regulator, and a differential oscillator. The peak detector detects the peak level of the oscillating signal. The amplitude regulator compares the detected peak level with a level-shifted reference voltage. If the detected peak level is determined as being greater than the level-shifted reference voltage, the common voltage of a differential amplifier disposed in the differential oscillator, configured to drive the crystal oscillator across its input terminals, is reduced so as to lower the amplitude of the oscillation signal. The reverse operation occurs if the detected peak level is determined as being smaller than the reference voltage.

In some embodiments, the peak detector includes a transistor adapted to receive the oscillating signal and to charge a capacitor to a voltage representative of the detected peak level. A second transistor disposed in the peak detector enables the capacitor to be discharged during off periods.

A pair of diode-connected transistors disposed in a first leg of the amplitude regulator generates the reference voltage. A second pair of transistors disposed in a second leg of the amplitude regulator shift the voltage level of the reference voltage. A differential amplifier disposed in the amplitude regulator compares and amplifies the detected peak level to the level-shifted reference voltage. If the detected peak level is greater than the level-shifted reference voltage, the node supplying voltage to an input terminal of a differential amplifier disposed in the amplitude regulator is reduced. This, in turn, causes a voltage controlling the common voltage of the differential amplifier disposed in the differential oscillator to decrease, thereby causing a reduction in the amplitude of the differential signal. If, on the other hand, the detected peak level is smaller than the level-shifted reference voltage, the node supplying voltage to the input terminal of the differential amplifier disposed in the amplitude regulator is reduced. This, in turn, causes the voltage controlling the common-voltage of the differential amplifier disposed in the differential oscillator to increase, thereby causing an increase in the amplitude of the differential signal.

DETAILED DESCRIPTION OF THE INVENTION

Figure 1:
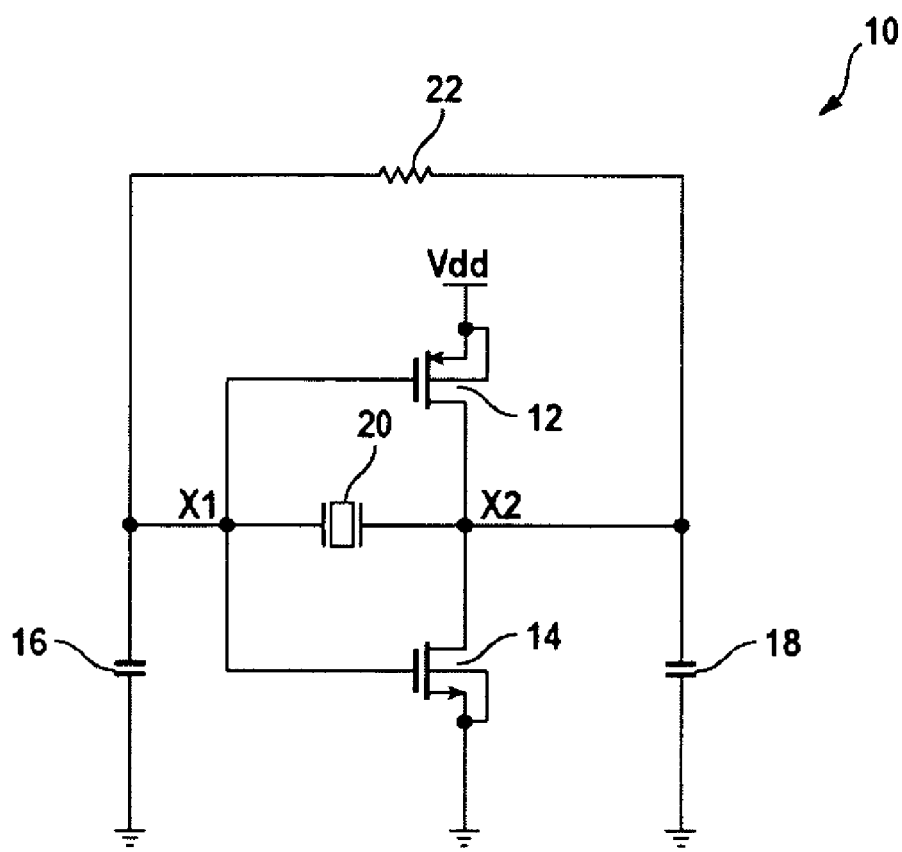
FIG. 1 is a schematic diagram of an oscillator, as known in the prior art.
Figure 2:
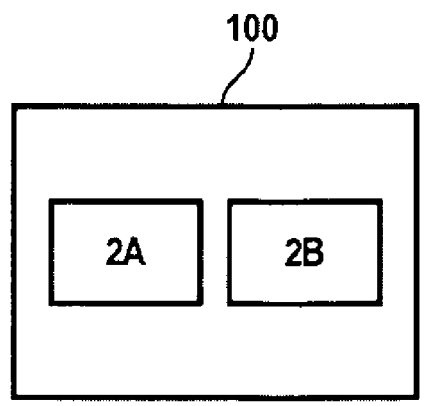
FIG. 2, are schematic diagrams of an amplitude-regulated crystal oscillator, in accordance with one embodiment of the present invention.
Figure 2A:
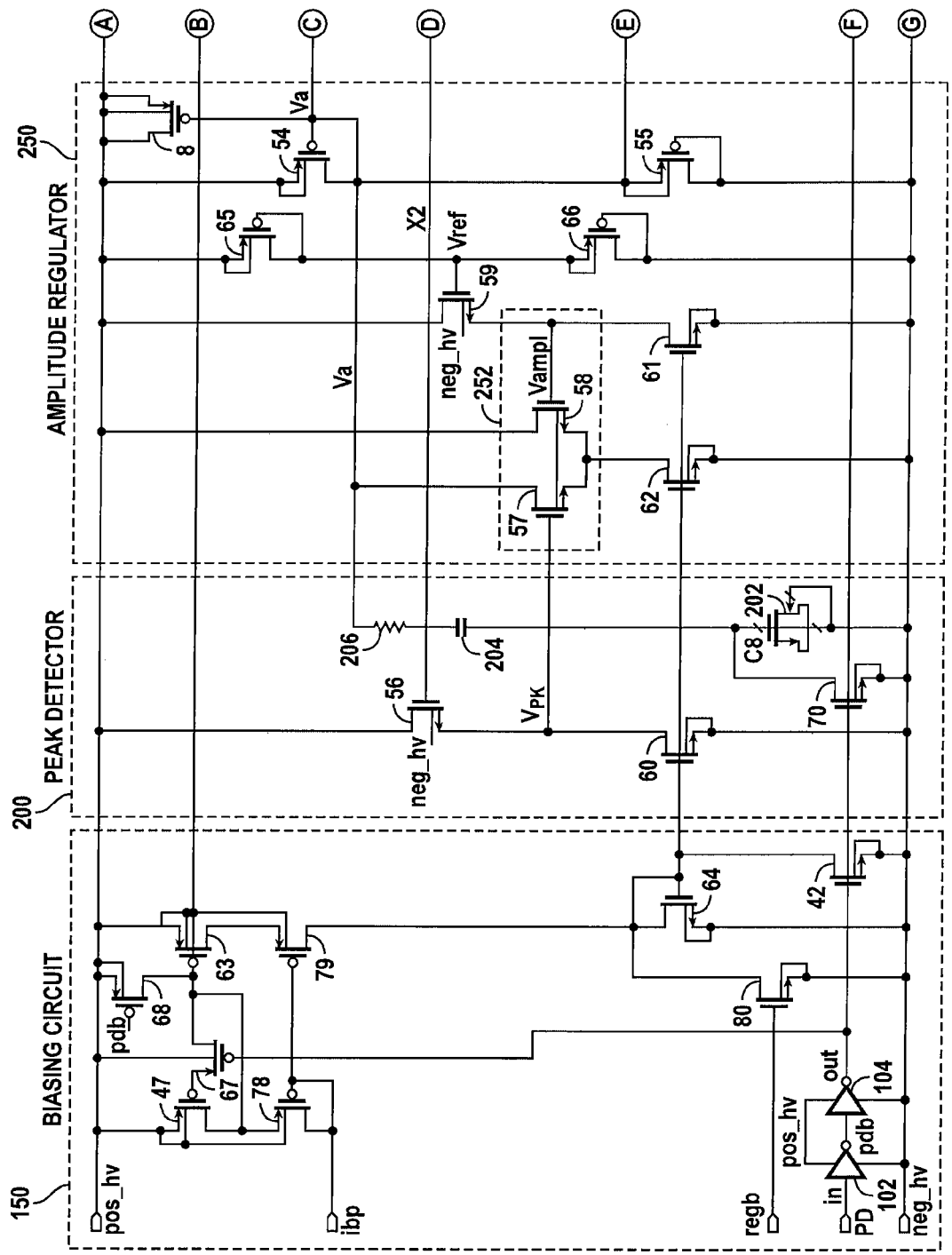
FIGS. 2A and 2B, collectively forming
Figure 2B:
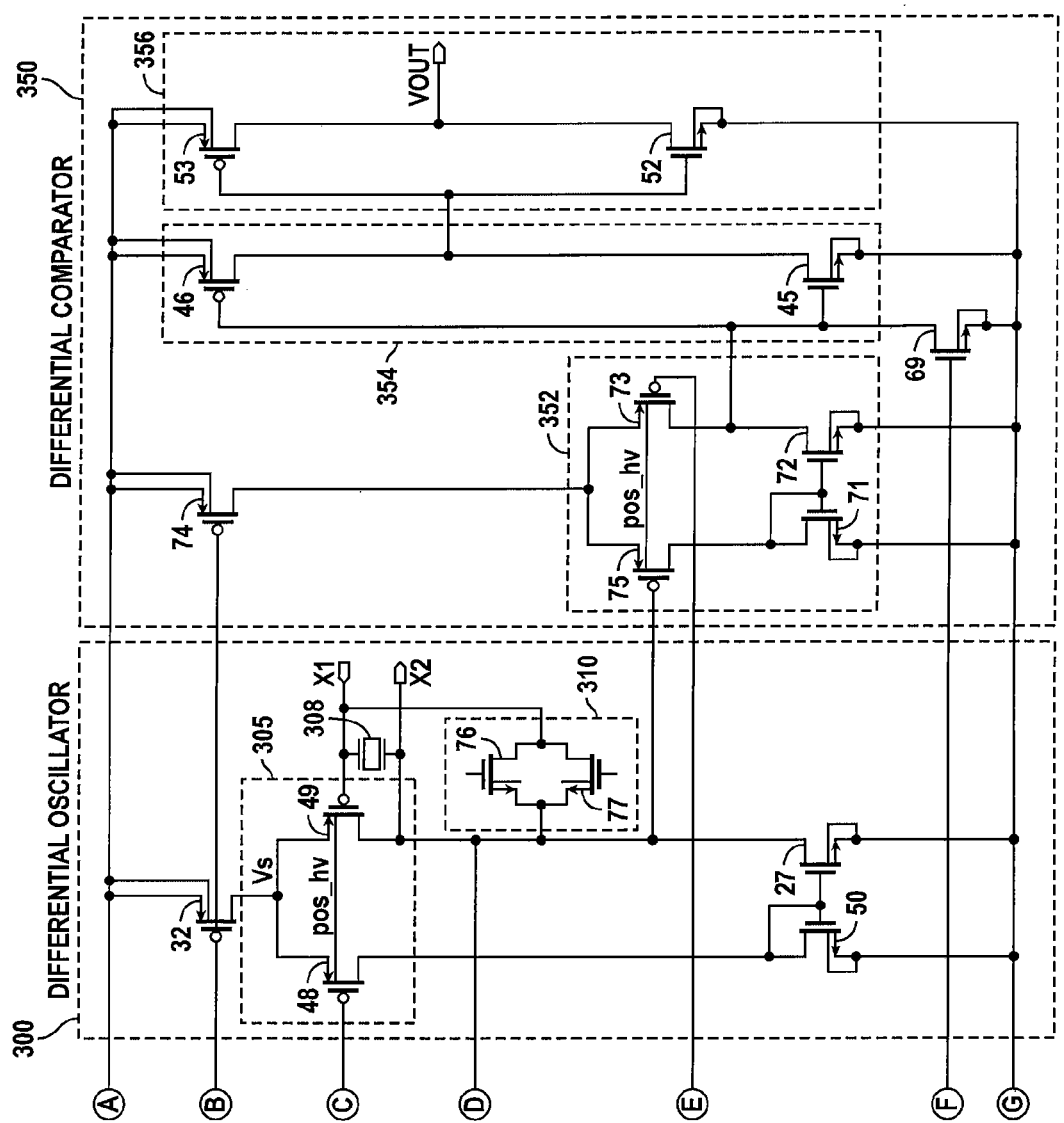

FIGS. 2A and 2B, collectively forming FIG. 2, are transistor schematic diagrams of an oscillator 100, in accordance with one embodiment of the present invention. Oscillator 100 is shown as including a biasing circuit 150, a peak detector 200, an amplitude regulator 250, a differential oscillator 300, and a differential comparator 350, in accordance with one embodiment of the present invention.

Transistors 47, 78, 63 and 79 of biasing circuit 150 form a cascode current mirror. Signal PD is applied to inverter 102 whose output signal PDB is applied to inverter 104. Signal PDB is applied to the gate terminal of PMOS transistor 68. The output signal of inverter 104 is applied to the gate terminal of transistor 67. Transistors 67 and 68 are used to power down biasing circuit 150, which in turn, turns off oscillator 100. Transistor 60 of peak detector 200 and transistors 61 and 62 of amplitude regulator 250 are current source transistors biased using diode-connected transistor current source 64 of biasing circuit 150. The signal PD is also used to power down current sources formed by transistors 60, 61 and 62. This, in turn, powers down oscillator 100.

Differential oscillator 300 includes a differential stage 305, that includes transistors 48 and 49. Current-source transistor 32 is used to bias differential oscillator 300. Transistors 50 and 27 provide a load to differential stage 305. Differential stage 305 is a differential inverter that inverts the signal received via node X1, coupled to the gate terminal of transistor 49, and generates a signal X2 coupled to the drain terminal of transistor 49. Transistors 76 and 77 form a transmission gate providing a resistive load between the gate and drain terminals of transistor 49. Crystal oscillator 308 is disposed between the gate and drain terminals of transistor 49 and is understood to be external to oscillator 100. Because of transmission gate 310 nodes X1 and X2 are at the same DC bias.

The amplitude of the oscillation signal generated by crystal oscillator 308, in accordance with one embodiment of the present invention, is allowed to oscillate between the ground potential—via transistor 27—and the voltage present on node Vs. The source terminals of both transistors 48 and 49, and the drain terminal of transistor 32 are also connected to node Vs.

The voltage at node Vs is controlled by the voltage at node Va to which the gate terminals of transistors 48 and 54 are coupled. In other words, the voltage variations at node Vs follow the voltage variations at node Va. Accordingly, by controlling the voltage at node Va, the amplitude of the signal between nodes X1 and X2 is regulated.

Transistor 60 together with transistor 56 and capacitor 202, in part, form a peak detector 200. Peak detector 200 is adapted to detect the peak amplitude of the voltage signal present on node X2. The detected peak level at node Vpk is smaller than the voltage present on node X2 by the threshold voltage of transistor 56. As the sinusoidal voltage on node X2 rises, the voltage at node Vpk that is coupled to the source terminal of transistor 56 also rises.

Figure 3:
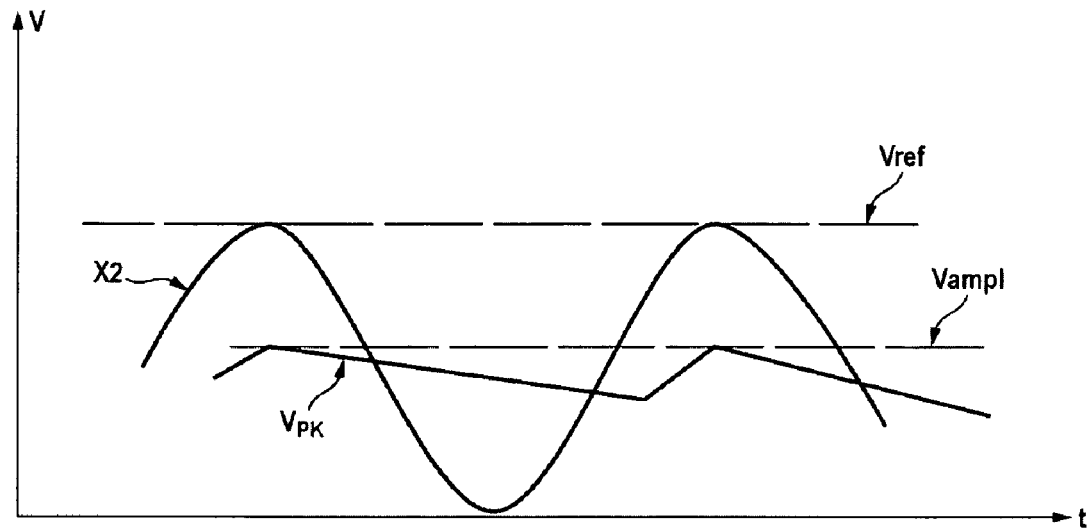
FIG. 3 is a timing diagram of a number of signals generated by the voltage-controlled crystal oscillator of FIG. 2, in accordance with one embodiment of the present invention.

Capacitor 202 stores the charges present on node Vpk. As the voltage on node X2 falls, because the source terminal of transistor 56 is maintained substantially at its peak value established by the charges stored in capacitor 202, transistor 56 is turned off. In other words, the voltage at node Vpk follows the voltage at node X2 as the voltage at node X2 rises, but droops down slowly as the voltage at node X2 falls. Transistor 60 is used to enable node Vpk to be reset to the ground potential when the oscillator 308 is shut down by providing a slow discharge path for the charges stored across capacitor 202. FIG. 3 shows a timing diagram of voltages at nodes X2, Vref, Vamp1 and Vpk. Capacitor 204, which is a compensation capacitor, together with resistor 206, which is a nulling resistor, ensure that the peak detector is stable and does not oscillate.

Amplitude regulator 250 includes, in part, a differential amplifiers stage 252 that is biased by transistor current source 62. The channel-widths and channel-lengths of diode-connected transistors 54 and 55 are selected so as to establish a desired DC bias voltage at node Va. For example, in one embodiment when the supply voltage Vcc is at 3 volts, the channel-widths and channel-lengths of transistors 54 and 55 are selected such that node Va is at 2 volts. Similarly, the channel-widths and channel-lengths of diode-connected transistors 65 and 66 are selected so as to establish a desired reference voltage at node Vref. The reference voltage level at node Vref is shifted down by the gate-to-source voltage of transistor 59 to generate the voltage at node Vamp1.

Transistors 59 and 61 together form a source-follower amplifier. Transistors 59 and 61 respectively match and track transistors 56 and 60 disposed in peak detector 200. Therefore, the voltage at node Vref defines, in part, the peak voltage of the oscillation. For example, if the voltage at Vref is set to 2 volts, the voltage at node X2 cannot exceed 2 volts.

The voltage at node Vamp1, i.e., the source terminal of transistor 59, is maintained equal to the voltage at node Vpk, i.e., the source terminal of transistor 56 by the differential stage 252. Therefore, the voltage at node Vref defines the voltage at node Vamp1, which in turn, defines the voltage at node Vpk.

Assume that the voltage at node Vpk rises in response to the rising amplitude of the voltage at node X2. Therefore, the voltage at node Vpk exceeds the voltage at node Vamp1. This causes transistor 57 to conduct more current, thereby pulling the voltage at node Va lower. The reduction in the voltage at node Va, in turn, causes the voltage at node Vs to go down, which in turn causes the amplitude of the voltage at nodes X1 and X2 to decrease. Therefore, if the amplitude of signals at node X1 and X2 exceeds Vref, amplitude regulator 250 reduces the voltage at node Va. This reduction, in turn, reduces the voltage at node Vs so as to cause the amplitude at nodes X1 and X2 to decrease. The reverse operations happen if the amplitude of signals at node X1 and X2 falls below the voltage at node Vref.

In the embodiment shown in FIG. 2, the voltage at node Vref is defined by the channel-width to channel-length ratio of transistors 65 and 66. It is understood, however, that any other circuit that generates a voltage reference, such as a bandgap circuit may also be used to establish the voltage at node Vref. As descried above, the voltage at node Vamp1 is level shifted with respect to voltage at node Vref. If the voltages at nodes Vamp1 and Vpk are equal, then the amplitude of signals X1 and X2 is the same as the voltage Vref.

If the amplitude of the signals at nodes X1 and X2 increases above Vref, the voltage at node Vpk increase, thereby causing the voltage at node Va to decrease. This, in turn, causes the voltage at node Vs to decrease thus causing the amplitude of signals X1 and X2 to decease until the amplitude of signals X1 and X2 reaches the voltage level defined by node Vref. If, on the other hand, the amplitude of the signals at nodes X1 and X2 falls below Vref, the voltage at node Vpk decreases, thereby causing the voltage at node Va to increase. This, in turn, causes the voltage at node Vs to increase thus causing the amplitude of signals X1 and X2 to increase until the amplitude of signals X1 and X2 reaches the voltage level of defined by node Vref. Consequently, by modulating the voltage at node Va using amplitude regulator 250, the amplitude of signals X1 and X2 is maintained at the voltage level defined by node Vref. Amplitude regulation is terminated when signal REGB applied to the gate terminal of transistor 80 is raised to a high voltage.

Differential comparator 350 is shown as including a differential amplifier 352 biased by transistor 74. The gate terminal of transistor 75, i.e., a first input terminal of the differential comparator 350, is coupled to node X2, and the gate terminal of transistor 73, a second input terminal of the differential comparator 350, is coupled to node Va. Any differential voltage between these two input terminals is amplified by differential amplifier 352 and buffered by inverters 354 and 356. The output signal of inverter 356 is a rail-to-rail oscillation signal that is used as a clock signal to other circuits.

Figure 4:
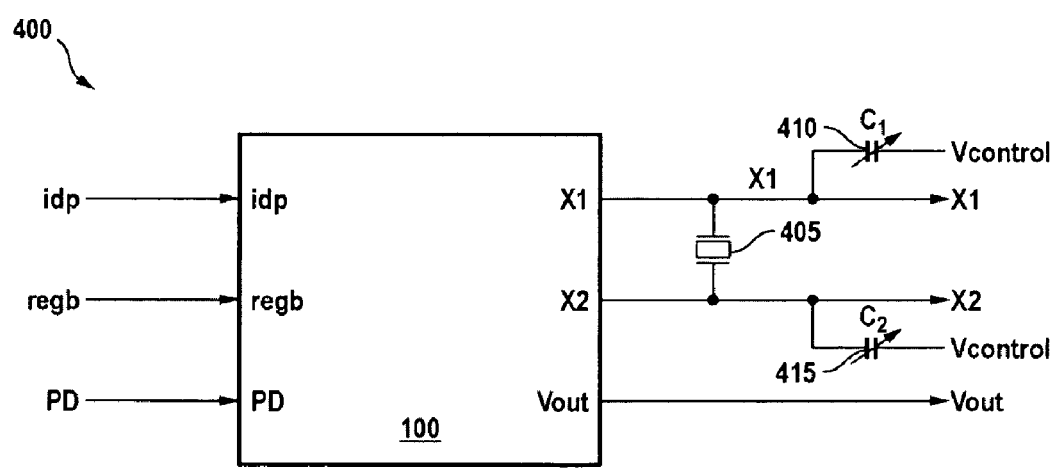
FIG. 4 is a schematic diagram of a voltage-controlled oscillator, in accordance with one embodiment of the present invention.

FIG. 4 is a schematic diagram of a voltage-controlled crystal oscillator 400, in accordance with one embodiment of the present invention. Voltage-controlled crystal oscillator 400 is shown as including, in part, a crystal oscillator 405, varactors 410, 415, and an oscillator 100, as described above. By varying the capacitances of the varactors, the frequency of operation of the signals carried between nodes X1 and X2 varies, thus allowing this oscillator to be used as a voltage-controlled-crystal-oscillator (VCXO). The VCXO when used in a feedback loop of a phased-locked-loop (PLL) provide a relatively tight frequency control.

The above embodiments of the present invention are illustrative and not limiting. Various alternatives and equivalents are possible. The invention is not limited by the type of peak detector, amplitude regulator, oscillator, differential or otherwise, comparator, etc. The invention is not limited to the frequency of oscillation. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A circuit comprising:
a peak detector adapted to detect a peak level of an oscillating signal;
a regulator adapted to define an upper limit of an amplitude of the oscillating signal in response to a first signal; and
an oscillator having a pair of output terminals configured to drive a crystal oscillator external to the circuit, wherein an output terminal of the oscillator generates the oscillating signal, wherein said regulator further comprises first and second transistors disposed in a first leg and adapted to establish a DC bias point of the first signal, wherein said first and second transistors are diode-connected transistors; and
a comparator adapted to a generate a rail-to-rail voltage signal in response to the oscillating signal.

2. The circuit of claim 1 wherein said regulator further comprises:
third and fourth diode-connected transistors disposed in a second leg and adapted to generate a reference voltage signal.

3. The circuit of claim 2 wherein said regulator further comprises:
a differential amplifier adapted to receive at its first terminal a second voltage signal generated by shifting the voltage level of the reference voltage signal, and a second terminal adapted to receive the detected peak level voltage, said differential amplifier adapted to vary the voltage level of the first signal in response.

4. The circuit of claim 3 wherein said regulator further comprises:
a fifth transistor having a gate terminal adapted to receive the reference voltage and a drain terminal adapted to supply the level shifted reference voltage; and
a sixth transistor adapted to receive the level-shifted reference voltage at its drain terminal; said sixth transistor receiving a gate voltage supplied by a second reference voltage.

5. The circuit of claim 4 wherein said peak detector further comprises:
a seventh transistor having a gate terminal adapted to receive the oscillating signal, and a source terminal adapted to supply the detected peak voltage level;
an eighth transistor adapted to receive the detected peak voltage level at its drain terminal, and a gate terminal adapted to receive the second reference voltage.

6. The circuit of claim 5 wherein the seventh transistor matches the fifth transistor and the eight transistor matches the sixth transistor.

7. The circuit of claim 6 wherein said oscillator further comprises:
a ninth transistor having a gate terminal adapted to receive the first voltage signal, and
a tenth transistor having a gate terminal coupled to a first terminal of the crystal oscillator and a source terminal coupled to the source terminal of the ninth transistor; wherein a drain terminal of the tenth transistor is coupled to a second terminal of the crystal oscillator.

8. The circuit of claim 7 further comprising:
a biasing circuit configured to supply the second reference voltage and further configured to power down the circuit.

9. A method of regulating an amplitude of an oscillating signal, the method comprising:
detecting a peak level of the oscillating signal;
defining an upper limit of an amplitude of the oscillating signal in response to a first signal;
comparing the detected peak level with the defined upper amplitude level to vary a voltage level of the first signal in response; and
maintaining the amplitude of the oscillating signal in accordance with the voltage level of the first signal
establishing a DC bias voltage of the first signal using first and second transistors disposed in a first leg, wherein said first and second transistors are diode-connected transistors.

10. The method of claim 9 further comprising:
generating a rail-to-rail voltage signal in response to the oscillating signal.

11. The method of claim 9 further comprising:
generating a reference voltage signal.

12. The method of claim 11 further comprising:
shifting the voltage level of the reference signal; and
amplifying a difference between the level-shifted reference voltage and the detected peak level of the oscillating signal; and
varying the voltage level of the first signal in response the amplification.

* * * * *